(12) United States Patent
Pau et al.

(10) Patent No.: US 10,783,652 B2
(45) Date of Patent: Sep. 22, 2020

(54) PLENOPTIC IMAGING APPARATUS, METHOD, AND APPLICATIONS

(71) Applicant: Arizona Board of Regents on Behalf of the University of Arizona, Tucson, AZ (US)

(72) Inventors: Stanley Pau, Tucson, AZ (US); Amit Ashok, Tucson, AZ (US)

(73) Assignee: Arizona Board of Regents on Behalf of the University of Arizona, Tucson, AZ (US)

( * ) Notice: Subject to any disclaimer, the term of this patent is extended or adjusted under 35 U.S.C. 154(b) by 0 days.

(21) Appl. No.: 16/098,913

(22) PCT Filed: May 3, 2017

(86) PCT No.: PCT/US2017/030752
§ 371 (c)(1),
(2) Date: Nov. 5, 2018

(87) PCT Pub. No.: WO2017/192663
PCT Pub. Date: Nov. 9, 2017

(65) Prior Publication Data
US 2019/0197714 A1   Jun. 27, 2019

Related U.S. Application Data

(60) Provisional application No. 62/332,738, filed on May 6, 2016.

(51) Int. Cl.
*G06T 7/557* (2017.01)
*H04N 5/225* (2006.01)
(Continued)

(52) U.S. Cl.
CPC ............. *G06T 7/557* (2017.01); *G02B 30/25* (2020.01); *G03B 35/10* (2013.01); *G03B 41/00* (2013.01);
(Continued)

(58) Field of Classification Search
CPC combination set(s) only.
See application file for complete search history.

(56) References Cited

U.S. PATENT DOCUMENTS 8,238,738 B2   8/2012   Georgiev
8,289,440 B2   10/2012  Knight
(Continued)

OTHER PUBLICATIONS

Tu, Xingzhou et al.; Optimized design of N optical filters for color and polarization imaging; Feb. 8, 2016; vol. 24, No. 3, Optics Express pp. 3011-3024; Copyright 2016 OSA.
(Continued)

*Primary Examiner* — Janese Duley
(74) *Attorney, Agent, or Firm* — Bond Schoeneck & King, PLLC; George McGuire; Erin Phillips (57) ABSTRACT

A polarization plenoptic camera that can acquire the polarization information of reflected light from an object in a single shot; i.e., in real time, to avoid issues such as motion blur and also avoid the additional system complexity that derives from mechanical scanning of a polarizer. The camera includes a polarization-sensitive focal plane array, a first microlens array having a pitch that is equal to a pitch of the pixel array; and either a second microlens array having a pitch that is greater than the pitch of the pixel array, a coded aperture mask, or a second microlens array and a coded aperture mask. A method for obtaining a plenoptic image of an object scene is disclosed.

11 Claims, 9 Drawing Sheets

(51) Int. Cl.
  *H01L 27/146* (2006.01)
  *G03B 41/00* (2006.01)
  *G03B 35/10* (2006.01)
  *H04N 13/232* (2018.01)
  *G02B 30/25* (2020.01)
  *G06T 7/521* (2017.01)

(52) U.S. Cl.
  CPC ........ *G06T 7/521* (2017.01); *H01L 27/14623* (2013.01); *H01L 27/14627* (2013.01); *H04N 5/2254* (2013.01); *H04N 13/232* (2018.05); *G06T 2207/10052* (2013.01)

(56) References Cited

U.S. PATENT DOCUMENTS

| | | | | |
|---|---|---|---|---|
| 8,400,555 | B1* | 3/2013 | Georgiev | H04N 5/23212 348/222.1 |
| 8,619,177 | B2 | 12/2013 | Perwass | |
| 8,866,997 | B2 | 10/2014 | Pau | |
| 2011/0069189 | A1 | 3/2011 | Venkataraman et al. | |
| 2011/0168903 | A1* | 7/2011 | Kyele | G01T 1/2914 250/370.1 |
| 2012/0038810 | A1* | 2/2012 | Taniguchi | H01L 27/14621 348/308 |
| 2012/0075513 | A1* | 3/2012 | Chipman | G01J 4/04 348/302 |
| 2012/0281072 | A1 | 11/2012 | Georgiev et al. | |
| 2013/0076910 | A1 | 3/2013 | Scott | |
| 2013/0265485 | A1 | 10/2013 | Kang | |
| 2014/0161363 | A1* | 6/2014 | Sargent | G06K 9/00355 382/224 |

OTHER PUBLICATIONS

Notification of Transmittal, International Search Report, and Written Opinion for PCT Application No. PCT/US2017/030752; Forms PCT/ISA/220, PCT/ISA/210, and PCT/ISA/237; dated Sep. 1, 2017; 10 pages.
H. G. Jeon et al.; Accurate Depth Map Estimation from a Lenslet Light Field Camera; 2015 IEEE Conference on Computer Vision and Pattern Recognition (CVPR), Jun. 7-12, 2015, pp. 1547-1555.
Y. Y. Schechner, Inversion by P4: polarization-picture post-processing, Phil. Trans. R. Soc. B 2011 366, pp. 638-648; copyright 2011 The Royal Society.
Ashok, Amit, et al. "Compressive light field imaging" In SPIE Defense, Security, and Sensing, pp. 76900Q-76900Q. International Society for Optics and Photonics, 2010. USA.
Babacan, S. Derin, et al. "Compressive light field sensing" IEEE Transactions on Image Processing vol. 21, No. 12 (2012): pp. 4746-4757; copyright 2012 IEEE.
Marwah, Kshitij, et al. "Compressive Light Field Photography using Overcomplete Dictionaries and Optimized Projections." ACM Transactions on Graphics (TOG) 32, No. 4 (2013): 46. USA.
Salahieh, Basel, et al. "Compressive Light Field Imaging Using Joint Spatio-Angular Modulation." In Computational Optical Sensing and Imaging, pp. CM4C-6. Optical Society of America, 2013. USA.
Jeon, Hae-Gon et al., Accurate Depth Map Estimation from a Lenslet Light Field Camera, IEEE Conference on Computer Vision and Pattern Recognition, pp. 1547-1555, Jun. 2015.
Tao, Michael W., et al., Depth from combining defocus and correspondence using light-field cameras, IEEE International Conference on Computer Vision, pp. 673-680, copyright 2013 IEEE.
Zhang, Song, High-speed 3D Imaging with Digital Fringe Projection Techniques, chapter 1, CRC Press, 2016.
Fenimore, E.E., et al., Coded aperture imaging with uniformly redundant arrays, Applied Optics, vol. 17, No. 3, pp. 337-347, copyright 1978 Optical Society of America.
Gottesman, Stephen R., et al., New family of binary arrays for coded aperture imaging, Applied Optics, vol. 28 No. 20, pp. 4344-4352, copyright 1989 Optical Society of America.
Finger, M.H., et al., Hexagonal Uniformly Redundant Arrays for Coded-Aperture Imaging, Proc. 19th Int. Cosmic Ray Conf. (Scientific and Technical Information Branch, NASA, Washington, DC), pp. 295-298, 1985.
Fresnel, A., Calcul de l'intensite de la lumiere au centre de l'ombre d'un ecran, Oeuvres completes d' Augustin Fresnel, vol. 1, Note 1, p. 365, 1866.
Ashok, Amit, et al., Pseudorandom phase masks for superresolution imaging from subpixel shifting, Applied Optics, vol. 46, No. 12, pp. 2256-2268, 2007.
Candes, Emmaunuel et al., "Decoding by linear programming," in IEEE Transactions on Information Theory, vol. 51, No. 12, pp. 4203-4215, Dec. 2005.
Tibshirani, Robert, "Regression Shrinkage and Selection via the Lasso," Journal of the Royal Statistical Society Series B, vol. 58, No. 1, pp. 267-288, 1996.
Bioucas-Dias, Jose M., et al., "A New TwIST: Two-Step Iterative Shrinkage/Thresholding Algorithms for Image Restoration", IEEE Transactions on Image Processing, pp. 1-12, Dec. 2007.

\* cited by examiner

PLENOPTIC IMAGING APPARATUS, METHOD, AND APPLICATIONS

RELATED APPLICATION DATA

This application is a U.S. National Phase filing of International Application No. PCT/US2017/030752, filed May 3, 2017, which claims priority to U.S. Provisional Application Ser. No. 62/332,738 filed May 6, 2016, the subject matter of each of which is incorporated by reference herein in their entireties.

BACKGROUND

Aspects and embodiments of the invention most generally pertain to an optical imaging apparatus, imaging methods, and applications thereof. More particularly, aspects and embodiments are directed to a plenoptic imaging apparatus, method, and applications and, most particularly to a polarization plenoptic camera and methods and applications to three-dimensional (3D) image reconstruction.

A plenoptic camera or a light field camera measures the plenoptic function, and captures information about the light field emanating from a scene; that is, the intensity of light in a scene and the direction that the light rays are traveling in space. This contrasts with a conventional camera, which records only light intensity. Some reported light field cameras use an array of micro-lenses placed in front of a conventional image sensor to sense intensity, color, and directional information. Other reported light field cameras substitute a coded aperture for the microlens array; however, this may reduce the amount of light reaching the detector as compared to the use of a microlens array.

A conventional light field camera generally does not measure polarization. While it is possible to measure polarization information by placing different polarizers in front of the imaging lens of such a camera and taking multiple images at different times and polarizer orientations, the inventors have recognized the benefits and advantages of a polarization plenoptic camera that can acquire the polarization information in a single shot; i.e., in real time, to avoid issues such as motion blur and also avoid the additional system complexity that derives from mechanical scanning of a polarizer.

SUMMARY

An aspect of the invention is a plenoptic imaging apparatus. In an embodiment the plenoptic imaging apparatus includes a polarization-sensitive focal plane array characterized by an array of pixels, in a division-of-focal plane architecture; a first microlens array disposed adjacent an object side of the pixel array, having a pitch that is equal to a pitch of the pixel array; and at least one of a second microlens array disposed at a fixed distance from the object side of the pixel array, having a pitch that is greater than the pitch of the pixel array, a coded aperture mask disposed at a fixed distance from the object side of the pixel array, and a second microlens array disposed at a fixed distance from the object side of the pixel array and a coded aperture mask disposed at a fixed distance from the second microlens array. In various non-limiting aspects and embodiments, the plenoptic imaging apparatus may further include or be further characterized by one or more of the following features or limitations alone or in various combination as appreciated by one skilled in the art:

wherein the second microlens array is characterized by a plurality of focal lengths;
wherein the pitch of the second microlens array is between 10-100 times the pitch of the pixel array;
wherein the coded aperture mask is a phase-only structure;
wherein the division-of-focal plane architecture includes a plurality of color and polarization filters.
further comprising an active illumination source adapted to illuminate the object scene;
 wherein the active illumination source has a user-controlled parameter including at least one of intensity, direction, color, polarization, coherence, spatial profile, and temporal profile.

An aspect of the invention is a method for obtaining a plenoptic image of an object. In an embodiment the method includes providing a plenoptic imaging apparatus including a polarization-sensitive focal plane array in a division-of-focal plane architecture; and, obtaining a single-shot measurement of a full Stokes vector at a plurality of spectral bands. In various non-limiting aspects and embodiments, the method may further include or be further characterized by one or more of the following features, steps, or limitations alone or in various combination as appreciated by one skilled in the art:

further comprising obtaining a single-shot measurement of a full Stokes vector at three spectral bands;
further comprising illuminating the object scene with structured light from an active illumination source;
 further comprising adjusting at least one of intensity, direction, color, polarization, coherence, spatial profile, and temporal profile of the structured light.

DETAILED DESCRIPTION OF EXEMPLARY, NON-LIMITING EMBODIMENTS OF THE INVENTION

FIGS. 1A-1D illustrate that measurement of polarization information, such as the Stokes vector of a scene, permits the separation of reflected and transmitted light at different surfaces, thus providing important information about the material properties of the object, increases signal-to-noise ratio, and enables imaging of objects that are not in direct line of sight, partially occluded, or obscured by an opaque medium.

FIGS. 2, 3, and 5A-5C illustrate the architectures of three exemplary embodied polarization plenoptic imaging systems 100. As described further below, one of the exemplary embodiments includes coded aperture(s) and a micropolarizer sensor; another exemplary embodiment includes a microlens array and a micropolarizer sensor; and a third exemplary embodiment includes a microlens array, a coded aperture(s), and a micropolarizer sensor.

Figure 1:
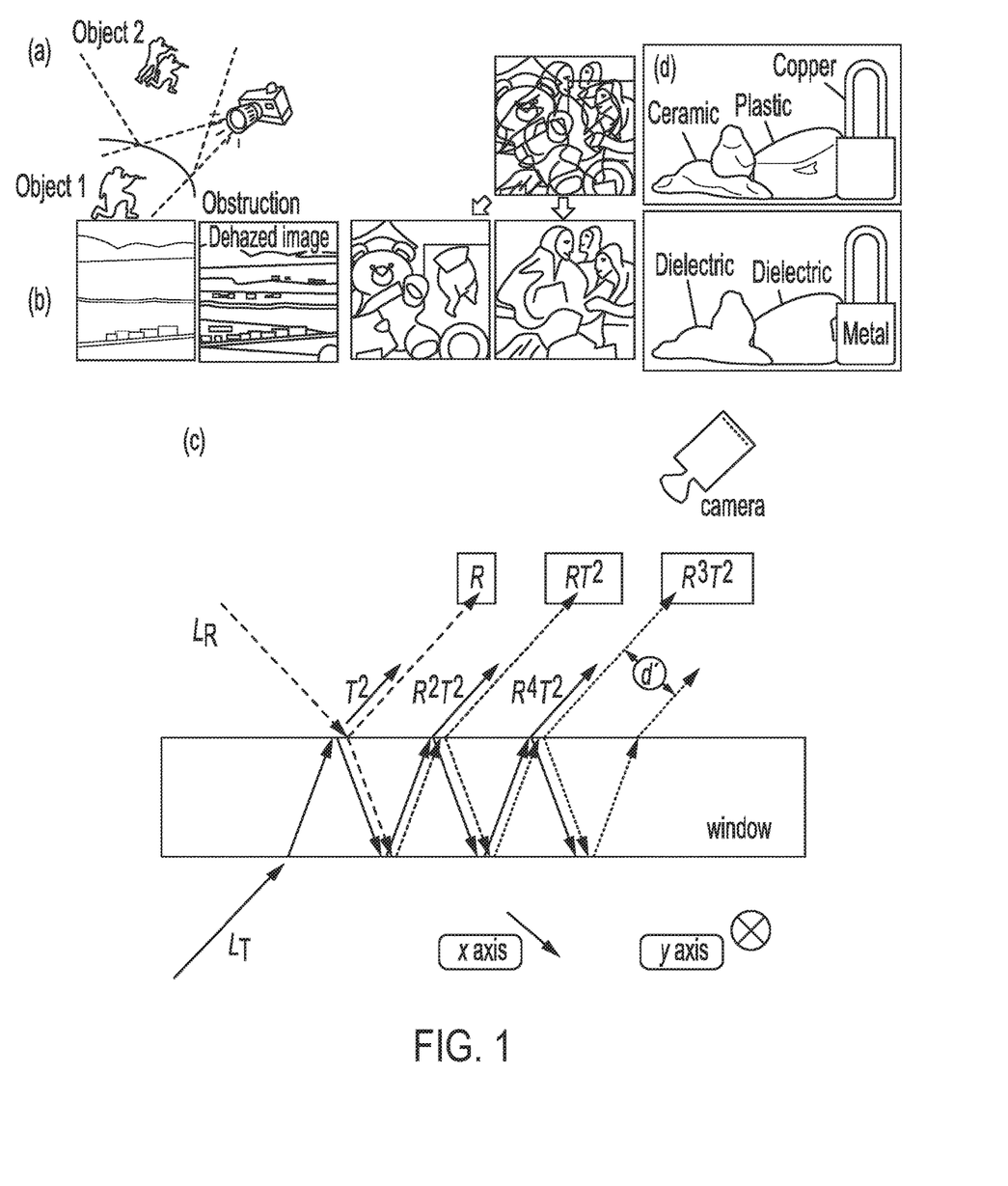
FIG. 1A illustrates the separation of reflected and transmitted images through a semi-transparent obstruction.
FIG. 1B illustrates imaging through haze using polarization analysis.
FIG. 1C illustrates separating reflected and transmitted objects through a window using polarization analysis.
FIG. 1D illustrates the use of polarization and color for material identification.
Figure 2:
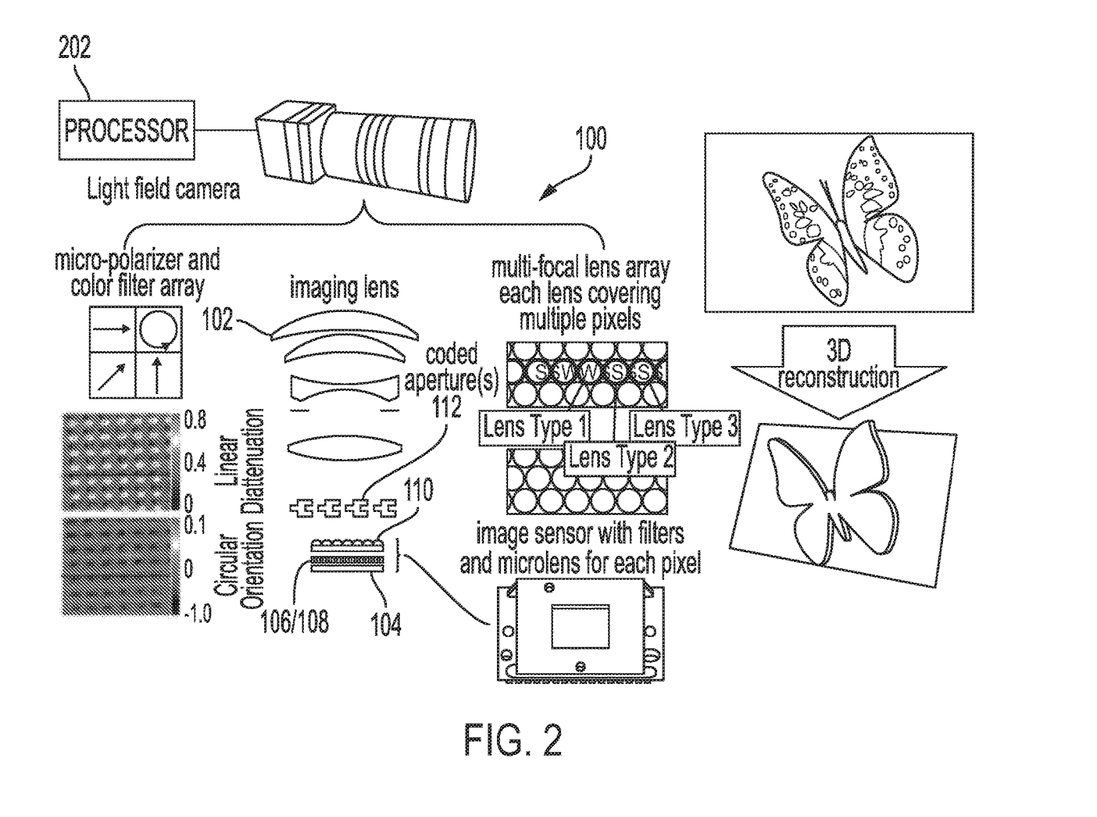
FIG. 2 schematically illustrates a light field camera architecture for measurement of color (red, green and blue), angle, and polarization of light (full Stokes), according to an illustrative embodiment of the invention.
Figure 3:
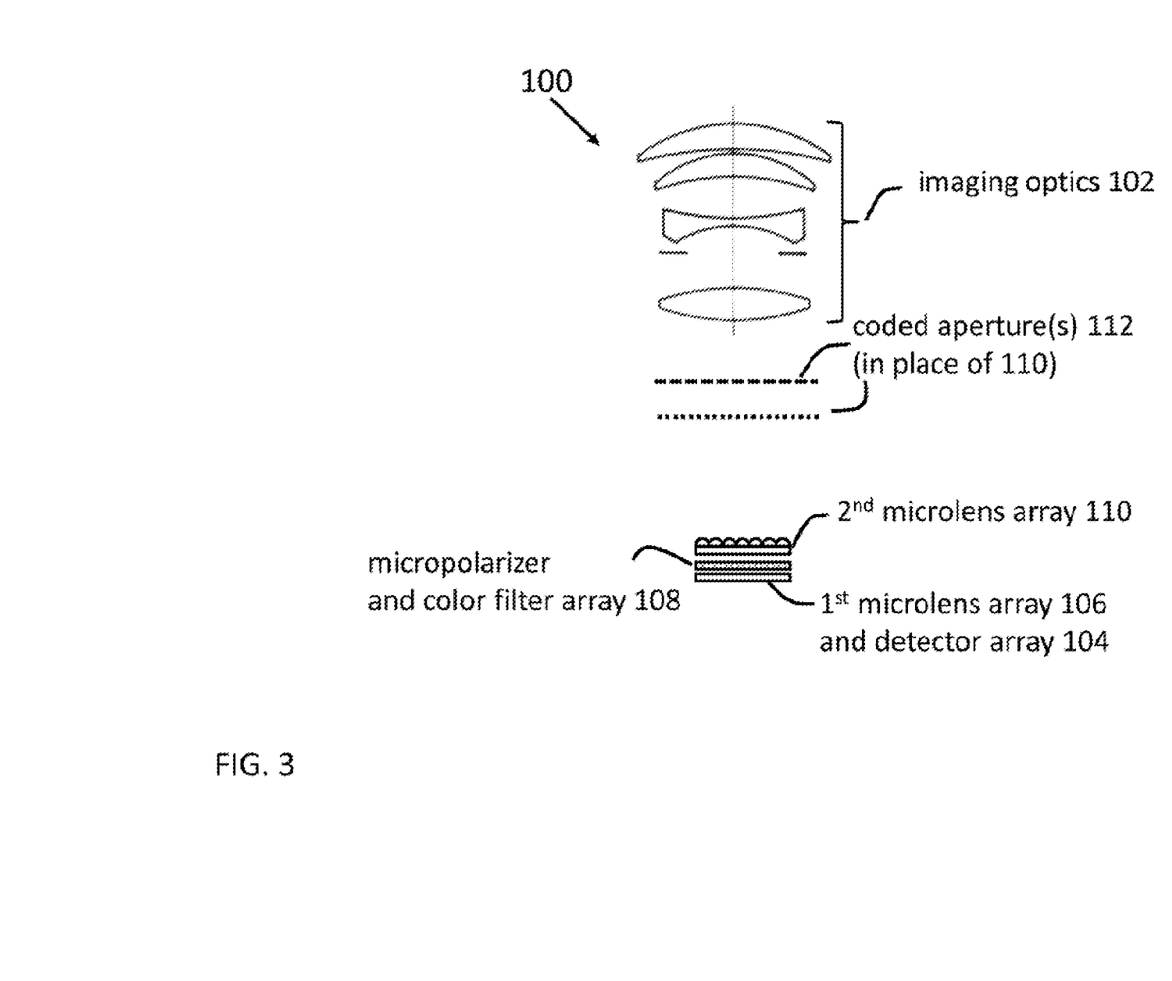
FIG. 3 shows a line drawing of a light field camera based on FIG. 2.

Referring to FIGS. 2 and 3, an embodied polarization plenoptic imaging system 100 referred to as a division-of-focal-plane imager includes a focal plane array 104 that advantageously is a polarization sensitive focal plane array using a pixelated array of micropolarizers as known from U.S. Pat. No. 8,866,997 (or equivalent detector(s) such as division-of-amplitude detector using beam splitter and multiple sensors). A first microlens array 106 is disposed on the object side of the detector pixel array 104, advantageously directly on top of the pixel array for the purpose of collecting and focusing light onto each individual pixel. The first microlens array 106 serves to cover and to collect light that falls outside of the light collection area of each pixel. The pitch of the first microlens array is advantageously the same as the pitch of the pixel array. In a non-limiting, exemplary embodiment the sensor pixel size is five (5) microns and is arranged in a square grid of pitch five (5) microns. The first microlens array has a dimension equal to the pitch of the pixel array, which is also five (5) microns. This first microlens array is overlaid on the pixel array to increase the fill-factor of the detector array. The focal length of the first microlens array is advantageously substantially the same as the diameter of each microlens, which is five (5) microns. The plenoptic imaging system 100 further includes microfilter elements 108 disposed immediately in front of (i.e., object side) each detector pixel. The micro-filter elements may be color and polarization filters that advantageously are equal in size to a single pixel on the detector. An exemplary configuration uses four polarizer orientations (0°, 45°, 90°, and circular) and three color filters (red, green and blue) as illustrated in FIG. 2. Examples of different filter configuration are described in Xingzhou Tu and Stanley Pau, *Optimized design of N optical filters for color and polarization imaging*, OPTICS EXPRESS, Vol. 24, No. 3 (2016). Further included in a first exemplary polarization plenoptic imaging system 100 is a second microlens array 110 disposed on top of (i.e., object side) the micro-filter elements 108 at a fixed distance. The pitch of the second microlens array 110 is larger and may typically be a multiple of ~10 to 100 times the pitch of the detector pixel array. In an example, the pitch is about 50 to 500 microns. The focal length of the second microlens array may be about one to two times the microlens dimension. In this example, the focal length may be 50 to 1000 microns. The second microlens array 110 may comprise microlenses having different focal lengths, which enable imaging at a larger depth-of-focus than the case of using microlenses of a single focal length. Finally, imaging optics 102 are disposed on the object side of the second microlens array at an appropriate distance.

In an alternative second exemplary embodiment of the polarization plenoptic imaging system, the second microlens array 110 is replaced by one or more coded aperture mask(s) 112 disposed at carefully selected locations in front of the sensor. These coded aperture mask(s) provide additional degrees of freedom for encoding the high-dimensional light field. Such encoding is especially advantageous as the polarization sensitive focal plane array makes a low-dimensional measurement of the encoded light field, which can then be inverted using appropriate regularization or priors using non-linear reconstruction algorithms to obtain a higher resolution estimate of the high-dimensional light field. As such, the coded aperture(s) serves as a pre-conditioner that reduces the calculation difficulties of the inverse problem using appropriate regularization and constraints. Other benefits of using a coded aperture include potential multiplexing signal-to-noise (SNR) advantage and the capability to acquire multiple measurements of a light field, as well as adaptation of measurements to improve the light field quality further. Furthermore, the coded aperture(s) can be made as phase-only structure(s), which leads to improved light collection efficiency for higher SNR performance of the camera.

There are several coded-aperture designs reported in the literature including, but not limited to, Uniformly Redundant Array (URA), Modified Uniformly Redundant Array (MURA), Hexagonal URA (HURA), Fresnel Zone Plate (FZP), and random phase diffuser, that can be used to encode the light field in any plane between the lens (i.e., Fourier plane) and the focal plane array (i.e., image plane). The encoded light field measurement at the focal plane array now serves as an input to the inverse problem of recovering the light field at higher spatial and angular resolution by exploiting the inherent sparsity/compressibility of the natural light field. There are numerous algorithms from the compressive sensing area that can be used to solve this inverse problem, such as l1-minimization, LASSO, and TwIST to recover a high-resolution light field reconstruction.

Figure 5:
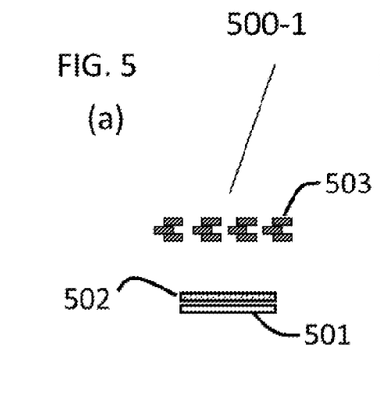
FIG. 5A schematically illustrates a plenoptic imaging apparatus utilizing a coded aperture(s) and a micropolarizer sensor.
FIG. 5B schematically illustrates a plenoptic imaging apparatus utilizing a microlens array and a micropolarizer sensor.
FIG. 5C schematically illustrates a plenoptic imaging apparatus utilizing a microlens array, a coded aperture(s), and a micropolarizer sensor, according to exemplary embodiments of the invention.

FIGS. 5A-5C more clearly illustrate the various embodied combinations of microlens arrays and coded apertures. FIG. 5A schematically illustrates a plenoptic imaging apparatus 500-1 utilizing a coded aperture(s) 503 and a micropolarizer sensor 501/502. FIG. 5B schematically illustrates a plenoptic imaging apparatus 500-2 utilizing a microlens array 504 and a micropolarizer sensor 501/502. FIG. 5C schematically illustrates a plenoptic imaging apparatus 500-3 utilizing a microlens array 504, a coded aperture(s) 503, and a micropolarizer sensor 501/502, according to exemplary embodiments of the invention.

Figure 4:
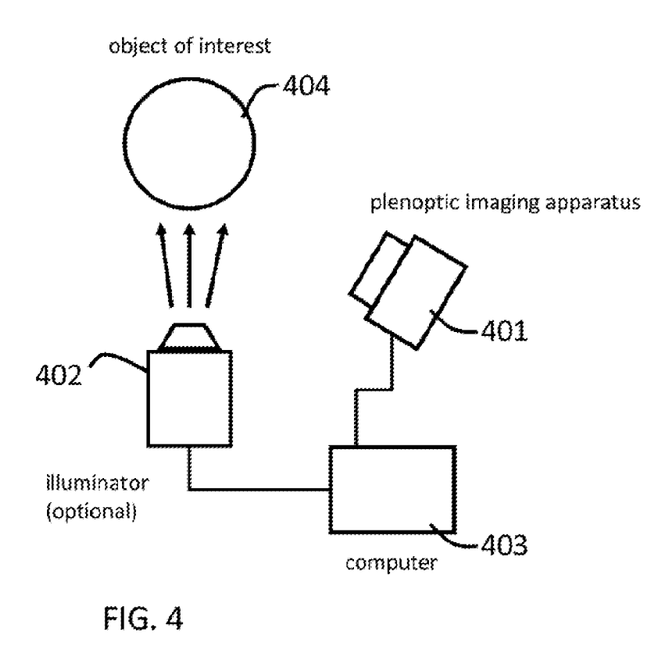
FIG. 4 schematically illustrates an application of a plenoptic imaging system with active illumination.

The embodied plenoptic imaging system(s) can operate in a natural light environment. For some applications, however, where natural light is insufficient or where high precision is advantageous, the plenoptic imaging system can also or alternatively operate in 'structured' light; i.e., using an active illumination source 402 as illustrated in FIG. 4. Both the illuminator and the plenoptic imaging apparatus are controlled by a computer 403. The illumination source 402 may be a simple light bulb, a light emitting diode, a laser, laser(s) with scanner, an image projector, or other structured illumination source as known in the art. The intensity, direction, color, polarization, coherence, and spatial/temporal profile of the light source can be controlled to maximize signal-to-noise ratio in the image acquisition; for example, structured light can be projected onto the object of interest 404 and an image can be acquired using the embodied polarization plenoptic imaging system 401. Structured light can have random or pseudorandom codifications, binary structured codifications, and N-ary codifications.

Figure 6:
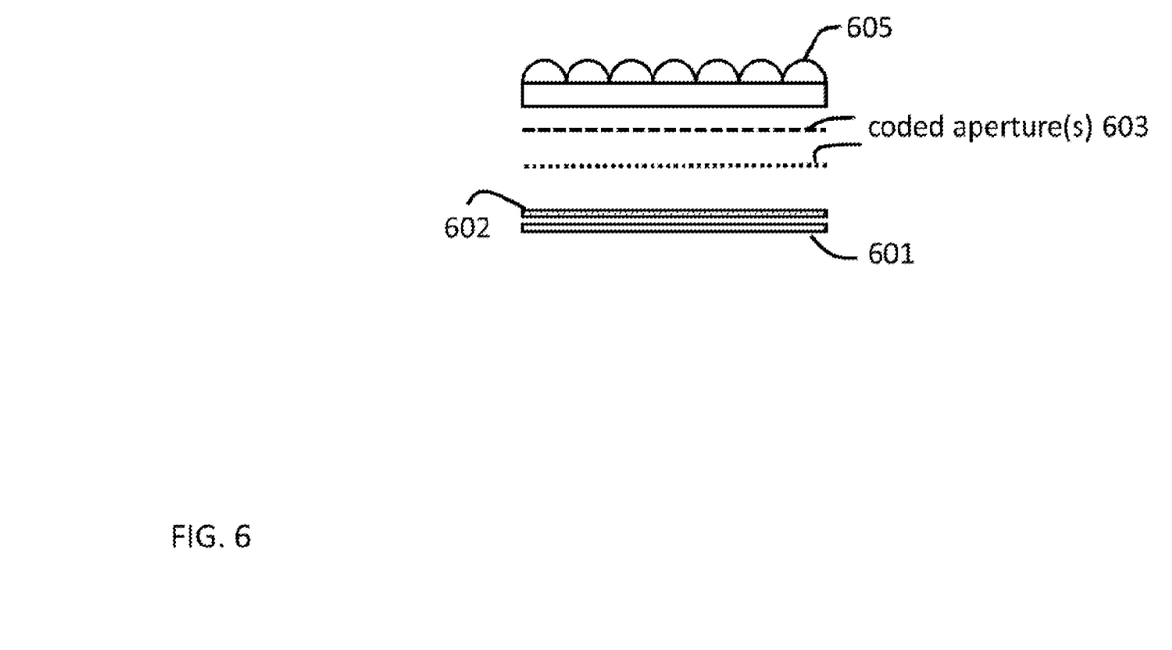
FIG. 6 schematically illustrates a plenoptic imaging apparatus utilizing an imaging lens array, according to an exemplary embodiment of the invention.

Another embodiment of the plenoptic imaging apparatus is shown in FIG. 6. For some applications, the imaging optics may be a single lens that collects light from a scene onto the sensor as shown in FIG. 3. The single lens can be made of multiple elements and thus be bulky. In FIG. 6, the imaging optics is a lens array 605. This configuration of lens array can potentially be flatter than the configuration of a single lens. In the lens array configuration, each lens collects light from the scene from a different perspective onto the sensor 601. The sensor raw data then consists of an array of images, each coming from a lenslet in the lens array. Note that each lens in the lens array can be made of multiple elements. Examples of lens array size can range from a 2×2 lens array to a 10×10 lens array. A 10×10 lens array allows simultaneously imaging of a scene at 100 different perspectives.

Figure 7:
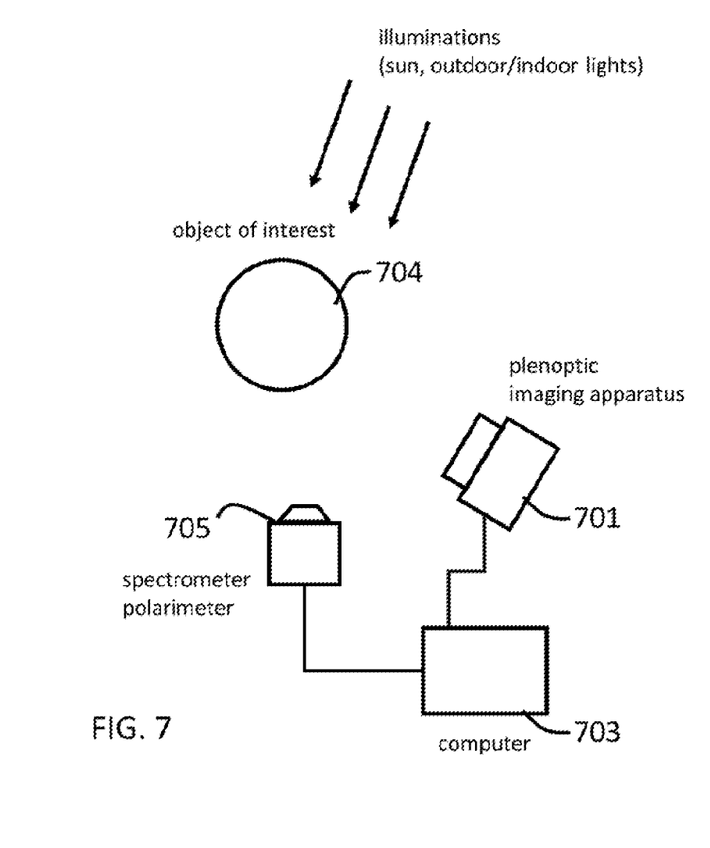
FIG. 7 schematically illustrates a plenoptic imaging apparatus utilizing passive illumination, according to an exemplary embodiment of the invention.

Another embodiment of the application of the plenoptic imaging apparatus is shown in FIG. 7. This configuration utilizes passive (natural) illumination. An object of interest 704 is illuminated by natural light such as the sun or scattered light from the sky. Such light can be partially polarized and spectrally broad. The illumination is not directly controlled by the user and the characteristic(s) of the illumination, such as wavelength, polarization, temporal and spatial profiles, is not known. This is especially true for the polarization state. In order to accurately characterize the reflected light from the object, the user needs to know the state of the natural light. This state can be measured independently and simultaneously by a separate polarimeter and/or spectrometer 705. The measurement can be performed by a simple detector, a spectrometer, a polarimeter, or a combination. Light from the object is measured by a plenoptic imaging apparatus 701. Both the polarimeter/spectrometer and the plenoptic imaging apparatus are controlled by a computer 703. Data from 705 and 701 are measured and can provide a more faithful representation and 3D reconstruction of the object of interest 704.

Figure 8:
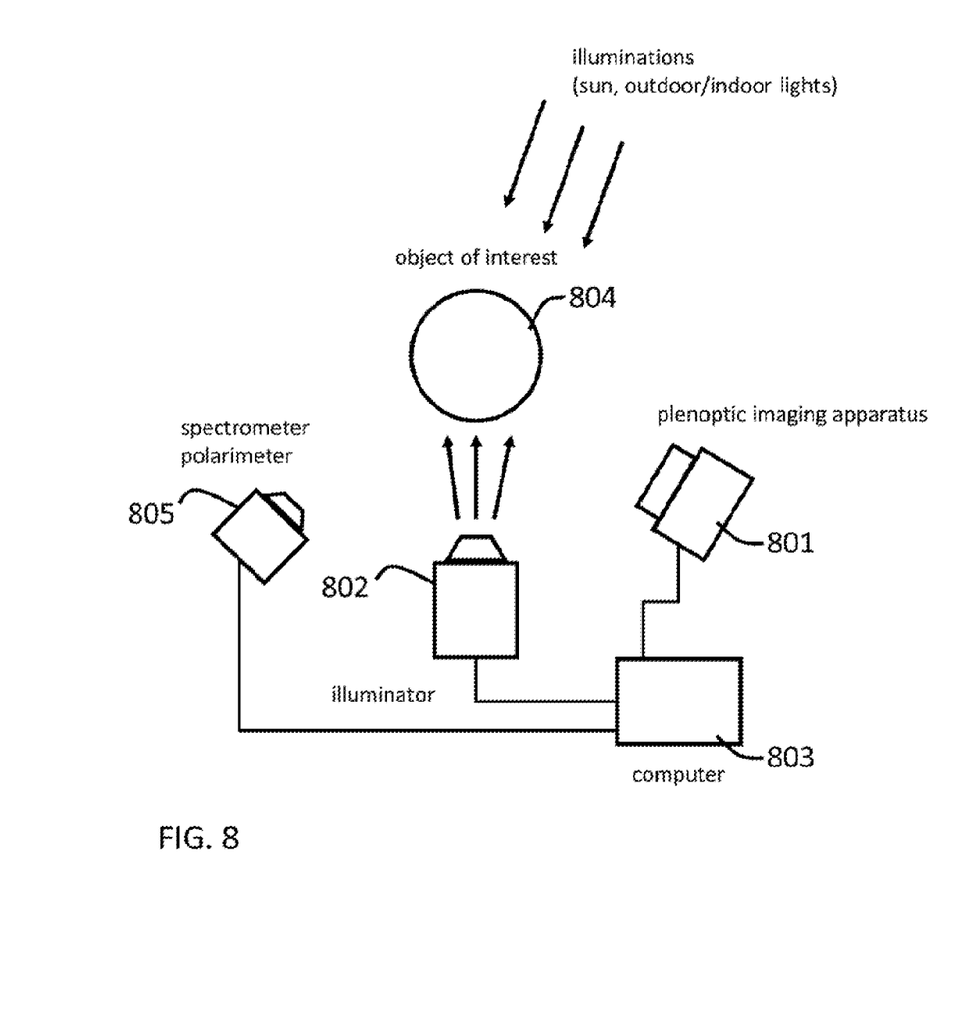
FIG. 8 schematically illustrates a plenoptic imaging apparatus utilizing both passive and active illumination, according to an exemplary embodiment of the invention.

Yet another embodiment of the application of the plenoptic imaging apparatus is shown in FIG. 8. This configuration utilizes both active and passive illumination. An object of interest 804 is illuminated by an illuminator 802 and natural light. The natural light is measured by a polarimeter and/or spectrometer 805. Light from the object is measured by a plenoptic imaging apparatus 801. The illuminator, polarimeter/spectrometer and the plenoptic imaging apparatus are controlled by a computer 803.

Figure 9:
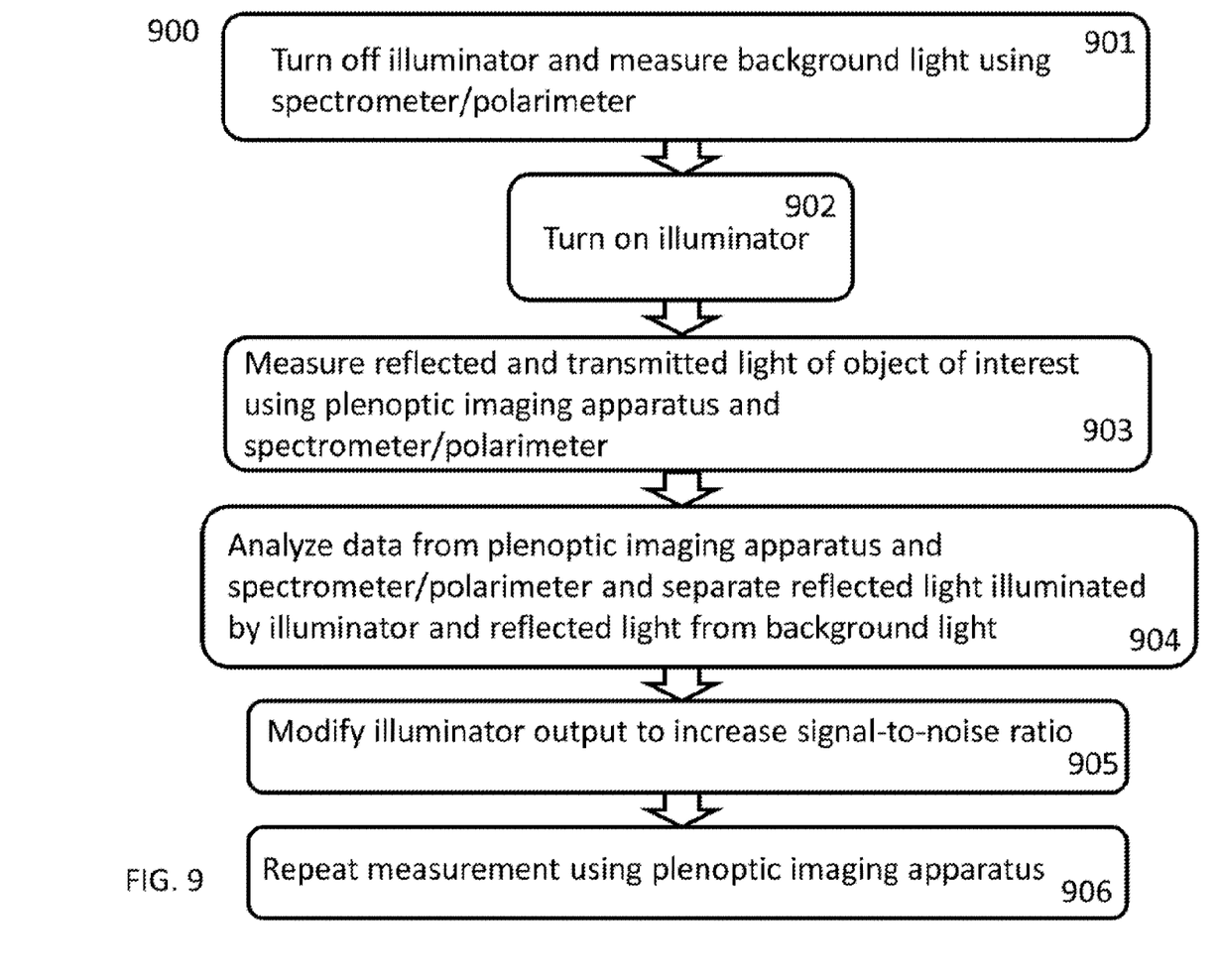
FIG. 9 shows a schematic diagram of a sequence of data acquisition, according to an exemplary embodiment of the invention.

FIG. 9 shows a schematic diagram 900 of a sequence of data acquisition. At 901 the active illuminator is OFF and background light is measured using a spectrometer/polarimeter. At 902 the active illuminator is turned ON. At 903, the reflected and transmitted light from the object of interest is measured using the plenoptic imaging apparatus and the spectrometer/polarimeter. At 904 data from the plenoptic imaging apparatus and the spectrometer/polarimeter are analyzed, and reflected light illuminated by the illuminator and reflected light from background light are separated. At 905 the active illuminator light output is modified depending on the state of the passive illumination in order to improve the signal-to-noise ratio of the measurement. At 906 the reflected and transmitted light from the object of interest is again measured using the plenoptic imaging system.

Light field cameras have been used for the purpose of depth measurement and 3D reconstruction of a scene. The camera can capture both light ray directions and intensity in a single shot. This information can be used to re-focus an image at different depths and permits an estimation of a depth map of a scene. An example of an image processing algorithm includes stereo matching of sub-aperture images to calculate distance and combination of depth cues based on defocus and correspondence to create high a resolution depth map. Numerous algorithms are known in the art.

In summary, 3D scene reconstruction requires the accurate measurement of the plenoptic function. The embodied polarization plenoptic camera enables measurement properties of light rays including: (1) wavelength, by using color filters at the pixel level, (2) light direction, by using a microlens array(s) and/or coded apertures, and (3) polarization, by using a micropolarizer(s) at the pixel level. The embodiments enable real time depth estimation of a moving object and can separate reflected and refracted images through polarization analysis. Thus the embodied invention adds new functionalities/information to existing plenoptic camera technology by measuring additional dimensions, spectral characterizations, and polarization of the light field with efficient, one-shot measurements.

All references, including publications, patent applications, and patents cited herein are hereby incorporated by reference in their entireties to the extent allowed, and as if each reference was individually and specifically indicated to be incorporated by reference and was set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein is merely intended to serve as a shorthand method of referring individually to each separate value falling within the range, unless otherwise indicated herein, and each separate value is incorporated into the specification as if it was individually recited herein.

All methods described herein may be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

We claim:

1. A plenoptic imaging apparatus, comprising:
a polarization-sensitive focal plane array characterized by a pixelated array of micropolarizers, in a division-of-focal plane architecture;
a first microlens array disposed adjacent an object side of the pixelated array of micropolarizers, having a pitch that is equal to a pitch of the pixelated array of micropolarizers; and
at least one of (i) coded aperture mask disposed at a fixed distance from the object side of the pixelated array of micropolarizers and (ii) a second microlens array disposed at a fixed distance from the object side of the pixelated array of micropolarizers and a coded aperture mask disposed at a fixed distance from the second microlens array.

2. The plenoptic imaging apparatus of claim 1, wherein the second microlens array is characterized by a plurality of focal lengths.

3. The plenoptic imaging apparatus of claim 1, wherein the pitch of the second microlens array is between 10-100 times the pitch of the pixelated array of micropolarizers.

4. The plenoptic imaging apparatus of claim 1, wherein the coded aperture mask is a phase-only structure.

5. The plenoptic imaging apparatus of claim 1, wherein the division-of-focal plane architecture includes a plurality of color and polarization filters.

6. The plenoptic imaging apparatus of claim 1, further comprising an active illumination source adapted to illuminate the object scene.

7. The plenoptic imaging apparatus of claim 6, wherein the active illumination source has a user-controlled parameter including at least one of intensity, direction, color, polarization, coherence, spatial profile, and temporal profile.

8. A method for obtaining a plenoptic image of an object scene, comprising:
providing a plenoptic imaging apparatus including a polarization-sensitive focal plane array characterized by a pixelated array of micropolarizers, in a division-of-focal plane architecture, a first microlens array disposed adjacent an object side of the pixelated array of micropolarizers, having a pitch that is equal to a pitch of the pixelated array of micropolarizers, and at least one of (i) a coded aperture mask disposed at a fixed distance from the object side of the pixelated array of micropolarizers and (ii) a second microlens array disposed at a fixed distance from the object side of the pixelated array of micropolarizers and a coded aperture mask disposed at a fixed distance from the second microlens array;
obtaining a single-shot measurement of a full Stokes vector at a plurality of spectral bands.

9. The method of claim 8, further comprising obtaining a single-shot measurement of a full Stokes vector at three spectral bands.

10. The method of claim 8, further comprising illuminating the object scene with structured light from an active illumination source.

11. The method of claim 10, further comprising adjusting at least one of intensity, direction, color, polarization, coherence, spatial profile, and temporal profile of the structured light.

* * * * *